United States Patent
Gerling et al.

(10) Patent No.: US 9,754,807 B2
(45) Date of Patent: Sep. 5, 2017

(54) HIGH DENSITY SOLID STATE LIGHT SOURCE ARRAY

(71) Applicant: APPLIED MATERIALS, INC., Santa Clara, CA (US)

(72) Inventors: John Gerling, Lafayette, CA (US); Joseph M. Ranish, San Jose, CA (US); Oleg V. Serebryanov, San Jose, CA (US); Joseph Johnson, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 610 days.

(21) Appl. No.: 14/182,879

(22) Filed: Feb. 18, 2014

(65) Prior Publication Data

US 2014/0270735 A1    Sep. 18, 2014

Related U.S. Application Data

(60) Provisional application No. 61/777,514, filed on Mar. 12, 2013.

(51) Int. Cl.
*H01L 21/67* (2006.01)
*C23C 14/54* (2006.01)
*C23C 16/46* (2006.01)

(52) U.S. Cl.
CPC ...... *H01L 21/67115* (2013.01); *C23C 14/541* (2013.01); *C23C 16/46* (2013.01)

(58) Field of Classification Search
CPC combination set(s) only.
See application file for complete search history.

(56) References Cited

U.S. PATENT DOCUMENTS

| 5,155,336 | A | | 10/1992 | Gronet et al. |
| 5,367,606 | A | * | 11/1994 | Moslehi ............ H01L 21/67115 118/724 |
| 5,930,456 | A | * | 7/1999 | Vosen ..................... C30B 31/12 219/405 |
| 6,476,362 | B1 | * | 11/2002 | Deacon ............. H01L 21/67115 118/50.1 |
| 6,740,906 | B2 | | 5/2004 | Slater, Jr. et al. |

(Continued)

FOREIGN PATENT DOCUMENTS

WO    WO 2012050607 A1 *   4/2012    ........... H01L 27/153

*Primary Examiner* — Quang D Tranh
*Assistant Examiner* — Renee Larose
(74) *Attorney, Agent, or Firm* — Moser Taboada; Alan Taboada

(57) ABSTRACT

Apparatus for providing pulsed or continuous energy in a process chamber are provided herein. The apparatus may include: a process chamber body of the semiconductor process chamber; one or more solid state source arrays providing pulsed or continuous energy to the process chamber, wherein each of the one or more solid state source arrays include a substrate having a plurality of solid state light sources disposed on a first surface of the substrate, wherein the plurality of solid state light sources are connected in series and in a recursive pattern on the first surface of the substrate, and a heat sink coupled to a second surface of the substrate configured to remove heat from the substrate; and a power source coupled to the one or more solid state source arrays to electrically power the plurality of solid state sources.

15 Claims, 5 Drawing Sheets

(56) References Cited

U.S. PATENT DOCUMENTS

| | | | |
|---|---|---|---|
| 6,805,466 B1 | 10/2004 | Ranish | |
| 6,818,864 B2 | 11/2004 | Ptak | |
| 7,514,305 B1 | 4/2009 | Hawryluk et al. | |
| 7,897,980 B2 * | 3/2011 | Yuan | F21K 9/00 |
| | | | 257/79 |
| 7,977,258 B2 | 7/2011 | Nenyei et al. | |
| 8,404,499 B2 * | 3/2013 | Moffatt | H01L 21/67115 |
| | | | 219/390 |
| 2003/0029859 A1 | 2/2003 | Knoot et al. | |
| 2008/0069550 A1 * | 3/2008 | Timans | C30B 31/12 |
| | | | 392/411 |
| 2008/0219650 A1 * | 9/2008 | Suzuki | H01L 21/67109 |
| | | | 392/408 |
| 2009/0296389 A1 * | 12/2009 | Hsu | G02F 1/133603 |
| | | | 362/235 |
| 2010/0059497 A1 | 3/2010 | Ranish et al. | |
| 2010/0142199 A1 * | 6/2010 | Liu | F21K 9/17 |
| | | | 362/234 |
| 2010/0267174 A1 | 10/2010 | Moffatt | |
| 2011/0246146 A1 * | 10/2011 | Kauffman | F21K 9/00 |
| | | | 703/2 |
| 2011/0297990 A1 * | 12/2011 | Shimizu | C09K 11/7767 |
| | | | 257/98 |
| 2011/0316009 A1 * | 12/2011 | Fukasawa | H01L 25/0753 |
| | | | 257/88 |
| 2012/0076477 A1 * | 3/2012 | Kuroiwa | F27B 17/0025 |
| | | | 392/416 |

* cited by examiner

US 9,754,807 B2

HIGH DENSITY SOLID STATE LIGHT SOURCE ARRAY

CROSS-REFERENCE TO RELATED APPLICATIONS

This application claims benefit of U.S. provisional patent application Ser. No. 61/777,514, filed Mar. 12, 2013, which is herein incorporated by reference.

FIELD

Embodiments of the present invention generally relate to semiconductor processing systems and, more specifically, to solid state light sources for use in semiconductor processing systems.

BACKGROUND

Several applications that involve the thermal processing of substrates such as semiconductor wafers and other materials involve the process steps of rapidly heating and cooling a substrate. Examples of such processing include rapid thermal processing (RTP), physical vapor deposition (PVD) processing, and the like, which are used for a number of semiconductor fabrication processes.

During semiconductor fabrication processing, heat energy from lamps is radiated into the process chamber and onto a semiconductor substrate in the processing chamber. In this manner, the substrate is heated to a required processing temperature. Typically, the use of conventional lamps (tungsten-halogen, mercury vapor, arc discharge) or electrical heating elements has been the dominant approach to delivering energy to the substrate for dopant annealing, film deposition, or film modification. These processes are often thermally based and typically require high process temperatures ranging from 200 C to 1600 C, which can result in significant thermal budget issues that adversely affect device performance. In addition, the use of conventional lamps has associated high maintenance costs with respect to operating lifetime, material and energy usage. Conventional lamps emit radiation over a broad spectrum of wavelengths which can be detrimental to some instrumentation and/or result in an unintended response in the target substrate/film from the undesired wavelengths.

Arrays of solid state light sources, for example Light Emitting Diodes (LEDs), may be used instead of, or in addition to, conventional lamps for various semiconductor fabrication processes to address some of the foregoing issues. In order to achieve target irradiance levels on the order of 1e6 W/m^2 that are comparable to the intensities required for RTP, high packing density of LEDs would need to be used. However electrical standards call for a minimum spacing requirement between conductors of different voltages to prevent electrical leakage and breakdown on a circuit board. This limits the configuration of LEDs for high voltage operation since the LEDs cannot be spaced too closely. Using more parallel arrays than series arrays to address this issue drives up the current requirements.

Accordingly, the inventors have provided an improved high density solid state light source array for use in semiconductor processing systems.

SUMMARY

Apparatus for providing pulsed or continuous energy in a process chamber are provided herein. The apparatus may include a substrate having a plurality of solid state light sources disposed on a first surface of the substrate, wherein the plurality of solid state light sources are connected in series and in a recursive pattern on the first surface of the substrate.

In some embodiments, an apparatus for providing pulsed or continuous energy in a process chamber may include: a substrate having a plurality of solid state light sources disposed on a first surface of the substrate, wherein the plurality of solid state light sources are connected in series and in a recursive pattern on the first surface of the substrate; a heat sink having a central opening, the heat sink coupled to a second surface of the substrate configured to remove heat from the substrate; and a set of electrical connectors disposed through the central opening of the heat sink and coupled to the substrate, wherein the set of electrical connectors electrically couple the substrate to a power source.

In some embodiments, an apparatus for providing pulsed or continuous energy in a process chamber may include: a process chamber body of the semiconductor process chamber; one or more solid state source arrays providing pulsed or continuous energy to the process chamber, wherein each of the one or more solid state source arrays include a substrate having a plurality of solid state light sources disposed on a first surface of the substrate, wherein the plurality of solid state light sources are connected in series and in a recursive pattern on the first surface of the substrate, and a heat sink coupled to a second surface of the substrate configured to remove heat from the substrate; and a power source coupled to the one or more solid state source arrays to electrically power the plurality of solid state sources.

Other embodiments and variations of the present invention are disclosed in greater detail below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of an apparatus for providing pulsed or continuous energy in a process chamber are provided herein. In some embodiments, the inventive apparatus may advantageously provide improved heating of substrates and other components disposed in a process chamber through the use of solid state light sources.

In the following description, the term substrate is intended to broadly cover any object that is being processed in a thermal process chamber. The term substrate may include, for example, semiconductor wafers, flat panel displays, glass plates or disks, plastic workpieces, and the like. In the following description solid state light point sources include light emitting diodes (LEDs) and LASERs. In addition, although described below in terms of LEDs or arrays of LEDs, LASERs and arrays of LASERs, other solid state light point sources may be used interchangeably in embodiments described herein.

Figure 1:
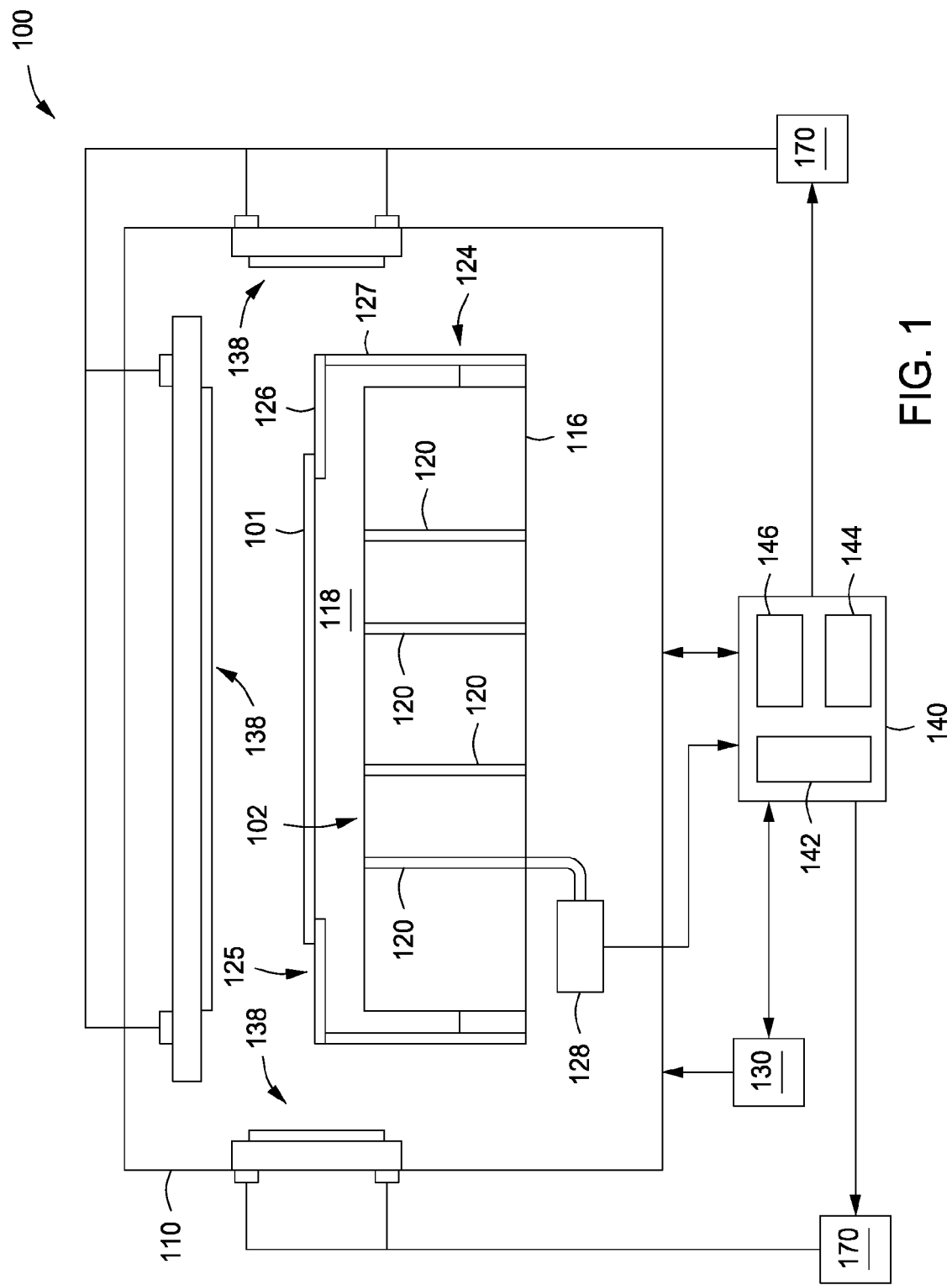
FIG. 1 is a schematic, cross-sectional view of a semiconductor substrate process chamber in accordance with some embodiments of the present invention.

FIG. 1 depicts a schematic of an exemplary process chamber 100 configured to perform thermal processes, such as a rapid thermal process (RTP), and suitable for use with the inventive LED source for heating substrates in accordance with some embodiments of the present invention. The process chamber 100 may be any type of process chamber having a substrate support configured to support a substrate (e.g., process chamber that includes a substrate support ring, a susceptor which holds the substrate in multiple places, air jets that holds the substrate in place) and having a reflector plate located along a back side of the substrate. Examples of suitable process chambers includes any of the RADIANCE®, RADIANCE® PLUS, or VANTAGE® process chambers, or any other process chamber capable of performing a thermal process, for example RTP, all available from Applied Materials, Inc., of Santa Clara, Calif. Other suitable process chambers, including those available from other manufacturers may also be used and/or modified in accordance with the teachings provided herein. For example, other suitable process chambers that may utilize the inventive LED source for heating substrates described herein include Physical Vapor Deposition (PVD) chambers, Chemical Vapor Deposition (CVD) chambers, Epitaxial Deposition chambers, etch chambers, Atomic Layer Deposition (ALD) chambers, etc.

The process chamber 100 may, for example, be adapted for performing thermal processes and illustratively comprises a chamber body 110, support systems 130, and a controller 140 that includes of a CPU 142, memory 144, and support circuits 146. The process chamber 100 depicted in FIG. 1 is illustrative only and other process chambers, including those configured for processes other than RTP, may be modified in accordance with the teachings provided herein.

The process chamber 100 includes a energy source 138, which may include a plurality of LEDs or array(s) of LEDs arranged in zones, wherein each zone of LEDs is separately controllable. In some embodiments, the energy source 138 may be a conventional lamp augmented with LEDs strewn about areas of the lamp head that had previously not been a light-emitting surface, increasing usage of the heat source surface area.

In FIG. 1, energy sources 138 are shown above the substrate 101 for heating an upper surface of the substrate 101, and on each side of the substrate 101 (which may be used, for example, to heat edge ring 126 which contacts substrate 101). Alternatively, energy sources 138 may be configured provide pulsed and/or continuous energy in process chamber 100. In some embodiments, energy source 138 may be used to heat the back side of the substrate 101, for example, such as by being disposed below the substrate 101, or by directing the radiation to the back side of the substrate 101. Each energy source 138 is coupled to one or more power sources 170 which may be coupled to controller 140 to separately control each energy source 138. The temperatures at localized regions of the substrate 101 are measured by a plurality of temperature probe assemblies, such as 120, that passes through a through a hole that extends from the back side of the base 116 through the top of a reflector plate 102. However, since the monochromatic properties of LEDs will not cause pyrometer interference, in some embodiments, temperature measurements may advantageously be obtained via pyrometers disposed anywhere in the chamber. The temperature probe assemblies 120 transmit sampled light from the reflecting cavity 118 to a pyrometer 128. The pyrometer 128 is connected to controller 140 which controls the power supplied to the energy source 138 (e.g., a lamp head) in response to a measured temperature. The energy sources 138 may be divided into multiple zones. The zones can be individually adjusted by the controller to allow controlled radiative heating of different areas of the substrate 101. In other embodiments, each light (LED or conventional light source) in energy sources 138 may be separately controlled to facilitate even finer control of the radiative heating.

In some embodiments, energy sources 138 can be placed on robot blades to activate or heat substrate 101 while the substrate is moving between process chambers. That is, in some embodiments, energy sources 138 (e.g., an LED source array) can be disposed in a process chamber, or can be placed on a robot that transfers a substrate 101 from one process chamber to another.

In some embodiments, a cooling mechanism may be used to cool the energy sources 138. Some exemplary cooling mechanisms may include, for example, the use of heat sinks coupled to or grown on (as discussed below) a backside of the energy sources 138. In some embodiments, the substrate on which the light sources are mounted or grown on may itself be a heat sink used for cooling. In other embodiments, energy sources 138 may be cooled by a gas or liquid circulated around or proximate to the energy sources 138.

A substrate support 124 included in chamber 100 may include parts of a process kit 125 which may be adapted to work with various embodiments of substrate supports and/or process chambers. For example, the process kit 125 may include elements of the substrate support 124, such as edge ring 126 and an edge ring support 127.

Figure 2:
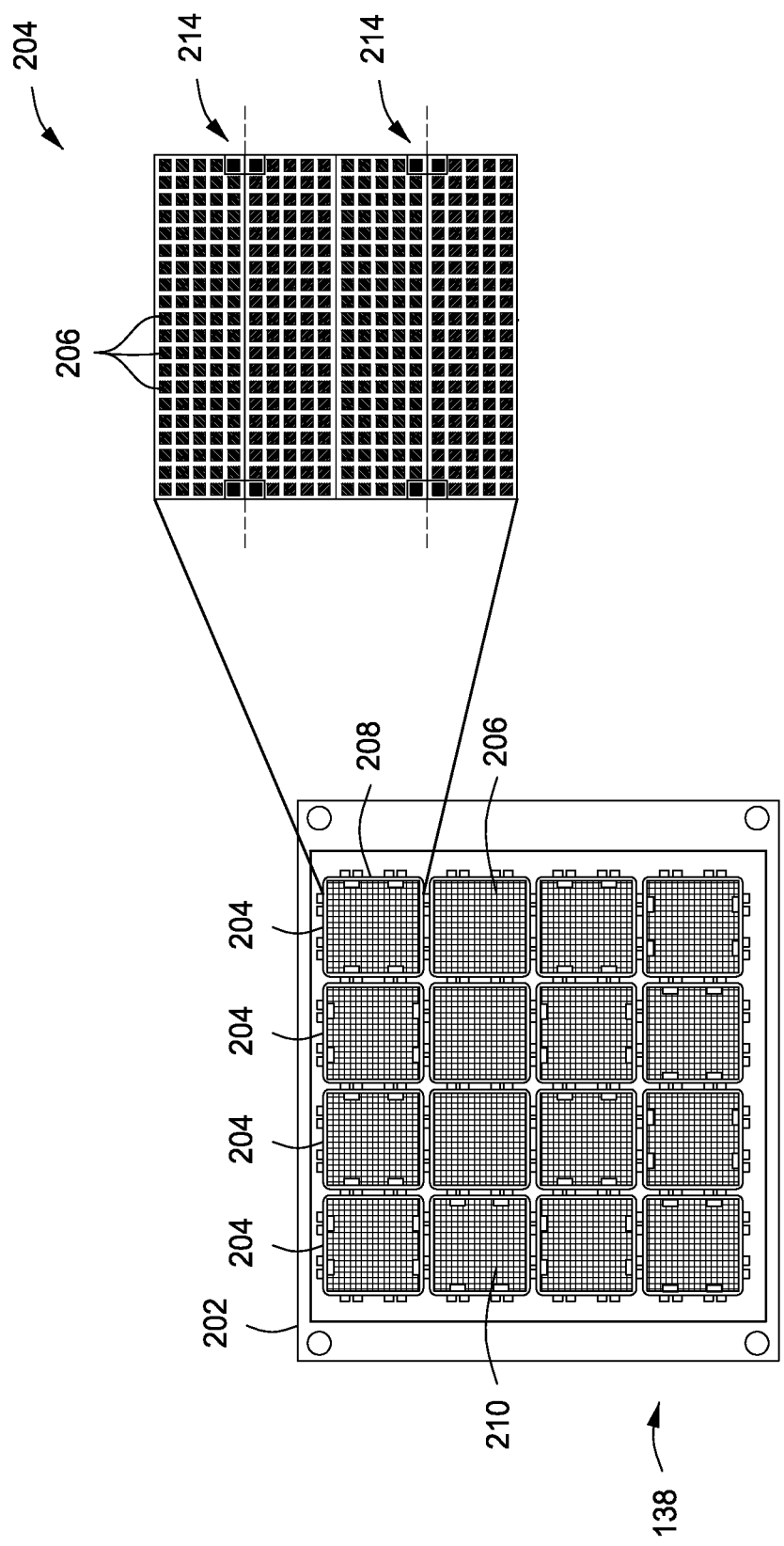
FIG. 2 is a top view of an solid state light source that includes a plurality of LED arrays in accordance with some embodiments of the present invention.

During processing, the substrate 101 is disposed on the substrate support 124. The energy source 138 is a source of radiation (e.g., heat) and, in operation, generates a predetermined temperature distribution across the substrate 101. In embodiments, where the heat source includes LEDs (as shown in FIG. 2), the energy source 138 may provide energy in wavelengths ranging from ultraviolet wavelengths to infrared wavelengths (e.g., about 100 nanometers (nm) to about 2000 nanometers (nm)). In some embodiments LED energy source 138 may provide energy in the microwave wavelength range. The LED energy source 138 provides heat radiation that is absorbed by the substrate 101. Although some of the heat radiation produced by an LED source may be reflected, substantially all of the heat radiation that is not reflected is absorbed by the target component being heated. In embodiments described herein, the substrate 101 may bow, for example up to about 5 mm, during heating. Thus, in some embodiments, the LED energy source 138 should be placed just far enough away to avoid contact if the substrate 101 bows, but close enough to provide the necessary uniform heat energy to the target substrate. In some embodiments, the LED energy source 138 may be bowed or shaped to compensate for the target substrate deformation.

In the exemplary processing chamber 100 described above, energy source 138 may be used to illuminate and heat the surface of a substrate to process the near surface region of the substrate. LED light sources offer a variety of advantages including higher efficiency and more rapid response times. Pulse widths are selectable and can range to less than a millisecond to more than a second.

In some embodiments, LED energy sources 138 may be used in conjunction with processing chambers to form films, treat dopants, change process gases (e.g., break bonds), and reorder the substrate itself. Additional high temperature substrate processing may benefit from LED heating as even higher output intensities become available. LEDs offer advantages when used to process the near surface region of a substrate. LEDs last a long time and allow the output intensity to be chosen independent from the wavelength(s) of the output illumination. Light emitting diodes (LEDs) may consist of gallium nitride, aluminum nitride, combinations thereof or other III-V materials grown on a substrate constructed to emit light close to one or more wavelengths determined by the bandgap of III-V materials in the active region. A phosphor may also be used to convert an emitted wavelength to a longer wavelength, reducing the energy of an emitted wavelength. It will be understood that the solid state sources described herein and depicted in the remaining figures may employ a phosphor in order to enhance absorption or enhance a chemical reaction.

Depending on the chemistries involved, illuminating a surface in the presence of gas precursor can enhance the rate of chemical reactions by thermal or other means. For example, the light may excite gas phase molecules, adsorbed molecules, or even excite the substrate to promote a chemical reaction on the surface. The wavelength of the LED may be selected to promote desirable film processes by, for example, choosing a wavelength which is resonant with a molecular electronic transition in order to enhance a reaction rate. The wavelength may also be chosen to enhance absorption of the radiation by the substrate, thereby heating the substrate more efficiently.

In some embodiments, each energy source 138 in FIG. 1 may include one large array of LEDs. However, depending on the heat energy and area to be heated, one large array of LEDs may require more power than can safely be provided without damage to the LEDs and associated circuitry. The inventors have observed that by modularizing LEDS into a plurality of smaller LED arrays, the smaller LED arrays can be more easily handled, manufactured, and powered. In addition, a plurality of smaller arrays of LEDs may also help in the event of LED failure. For example, in some embodiments, if one led fails and becomes an open circuit, then only the heat emitted from the small LED array is lost. If one large array of LEDs is used, then one LED failure may cause all processing to stop. In some embodiments, each of the plurality of smaller LED arrays can have different modules with different wavelengths. In some embodiments, each LED array can be removed and replaced with another LED array with different wavelengths.

FIG. 2 shows at least one exemplary embodiment of an energy source 138 that includes a plurality of LED arrays 204 disposed on a LED substrate 202 for thermally processing other substrates and/or heating various processing chamber components disposed in the processing chamber.

In some embodiments, energy source 138 may illustratively be between 100 mm and 480 mm in length and between 100 mm and 480 mm in width. In addition, various size energy sources 138 may be used as required or desired in any particular application. In some embodiments, each LED array 204 may be about 20 mm by about 20 mm square, although other size LED arrays 204 may be used. Each LED array 204 may contain between about 50 and about 500 LEDs 206 (e.g., 384 LEDs as shown in FIG. 2B). LEDs 206 may be spaced between about 0.1 mm and about 0.5 mm apart. LED arrays 204 may be spaced between about 0.5 mm and about 4 mm apart. Each LED 206 in LED arrays 204 may emit light and heat energy from one or more exposed surfaces. In some embodiments, all exposed surfaces of each LED 206 may emit light and heat energy. In some embodiments, each LED may be about 0.7 mm by about 0.7 mm square and about 0.3 mm in height, although other size LED 206 may be used. LEDs 206 may emit wavelengths in the Ultra Violet (UV) (200-400 nm), visible light (400-700 nm) and near infrared (700-1000 nm) wavelength ranges. In some embodiments that require high intensity output, the optical output of LEDs 206 are on the order of 1 W/mm^2 or greater, which corresponds to a target irradiance of 1e6 W/m^2 with sufficiently high packing densities. With sufficiently high packing densities of LEDs 206 over a given area, the LED arrays 204 advantageously provide the ability to achieve rapid thermal processing. In addition, LEDs can also be operated at a lower intensity as needed for other processes that do not require high power. The wide range of available wavelengths for LEDs advantageously enable wavelength specific, high intensity sources for industrial applications. Multi-wavelength capability can be realized in a single LED array 204 or across multiple LED arrays 204 in a system. Due to the high efficiency of LEDs (60-80% efficiency), less energy is converted to waste heat which can reduce thermal management issues.

In addition, LEDs 206 and LED arrays 204 have faster on-off switching times than incandescent lamps. In some embodiments, the LEDs have on-off switching times on the order of nanoseconds versus hundreds for milliseconds for incandescent lamps. Specifically, in some embodiments, the LEDs have a switch-on time from about 0.5 nanoseconds to about 10 nanoseconds and a switch-off time from about 0.5 nanoseconds to about 10 nanoseconds. Faster on-off switching times enables shorter thermal exposures. The use of small form factor LEDs as described above makes it possible to design conformal high intensity illumination systems at a lower cost of ownership, longer operating lifetime (~100 k hours) and in the case of UV LEDs, an environmentally sensitive alternative to toxic mercury vapor based lamps.

In some embodiments, the LED array 204 can be individual LED chips 206 with different wavelengths, or the LED array 204 can be a collection of LED lamps with different wavelengths. The LEDs can be multiplexed/rasterized such that certain LEDs with certain wavelengths are activated at one time. For example, at time 1t, only λ1 LEDs are active, at time 2t only λ2 LEDs are active, etc. Thus, the LEDs in LED array 204 can be grouped and separately controlled by a controller (e.g., controller 140).

In some embodiments, the reflectors 208, 210 are configured to reflect the light and heat energy emitted from the LED towards the desired target (e.g., wafer substrate, or other process chamber component, etc.). In the case of LASERS, the reflectors 208, 210 could direct the light off of the LASER beams' axis to heat a wafer substrate or desired process chamber component. The reflectors 208 and 210 may be angled to reflect radiated LED light in a desired direction. In some embodiments, the angles of the incline of the reflector surfaces from the LED substrate 202 surface is between about 45 to 55 degrees from an axis of the LED extending in a direction toward where light energy is desired (e.g., for a planar array of LEDs, the axis may be perpendicular to the planar array), however, any angle which maximizes the angle and desired length of the reflector based on the space available between two neighboring LEDs 206, or LED arrays 204, may be used. In other embodiments, the surfaces of the reflectors 208, 210 may be perpendicular to the surface of the LED substrate 202. Still, in other embodiments, the surface of the LEDs 206 may be angled instead of, or in addition to, the surface of the reflector. In some embodiments, the height of the reflectors 208, 210 is at least the same height as the height of the LEDs 206, but may be higher or lower than the LEDs 206 as required.

In some embodiments each LED 206 may be individually mounted on LED substrate 202. Each LED 206 may be mounted to the substrate via eutectic bonding, including wire-bond-free direct attach LEDs. To direct attach LEDs to a substrate, a flux is first disposed on the substrate surface to which the LEDs will be attached. The LEDs are then disposed over this surface. The LEDs and the surface are then heated with a certain heating profile. An amount of solder disposed on the bottom of the LED will melt with help of the flux, and will attach the LED to the fluxed surface. In some embodiments, each LED 206 may be grown on LED substrate 202. The LEDs 206 may be individually grown, grown in groups/sections, or grown all together at the same time. In some embodiments, the LED substrate 202 that LEDs 206 are grown on may be an n-type substrate, with an electrode (e.g., 214) attached to the p-type layer 240 deposited on its surface. Silicon substrates or sapphire substrates may be used as well. The substrate can be any material that is thin enough, or has a high thermal conductivity, such that it is able to dissipate heat from the LEDs quickly while also providing electrical isolation of the LEDs from the rest of the system. This can be done by using an electrically isolating material. LEDs can be grown on any material where the lattice structure of the substrate can be made to match the lattice structure of the LED material through, but not limited to, direct deposition, application of a buffer layer, and/or any type of stress relaxation. In some exemplary embodiments, the substrate can be ceramic. In some embodiments, islands of non-substrate material/chemistries may be grown or included in the substrate to help facilitate LED growth.

Figure 4:
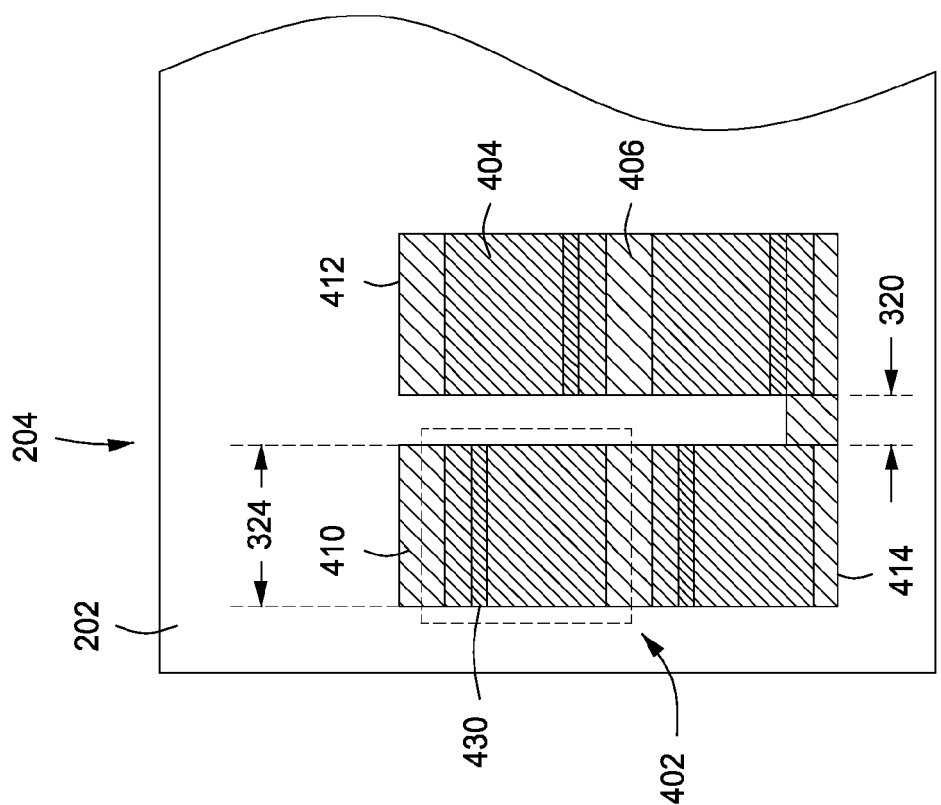
FIG. 4 is a schematic top view of a portion of a direct attach LED array in accordance with some embodiments of the present invention.
Figure 3:
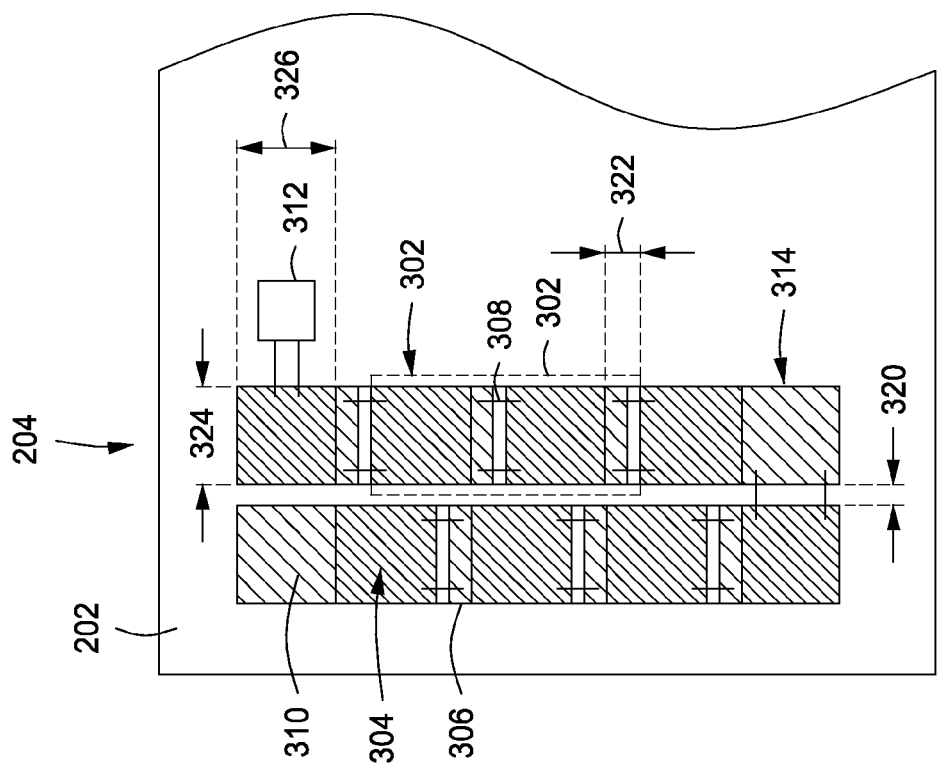
FIG. 3 is a schematic top view of a portion of a wire bond LED array in accordance with some embodiments of the present invention.
Figure 5:
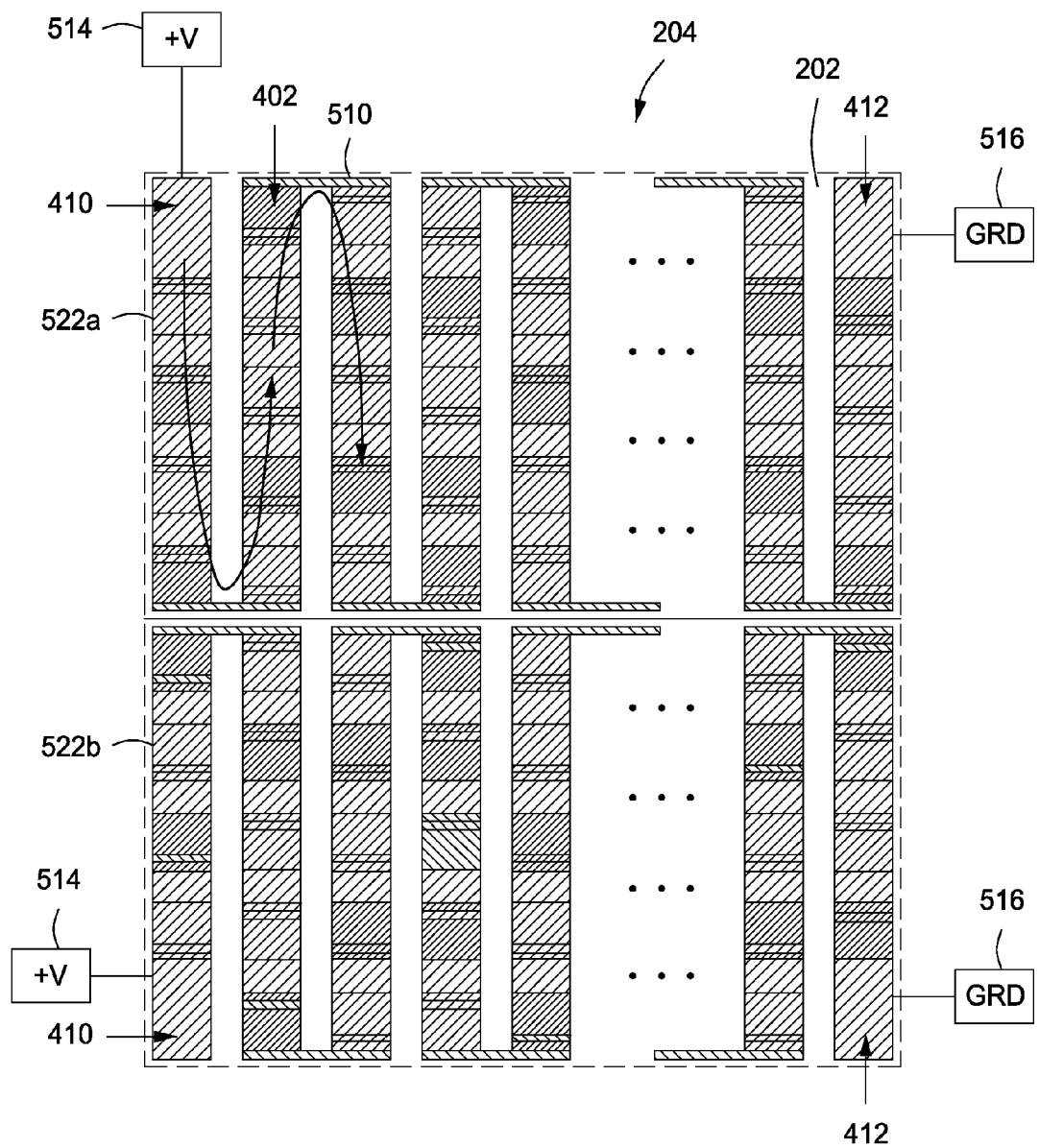
FIG. 5 is schematic top view of a high density solid state light source array in accordance with some embodiments of the present invention.

In some embodiments, the LEDs 206 in LED arrays 204 are connected in series as shown in FIGS. 3-5. In some embodiments, multiple strings of LEDs 206 may be disposed on substrate 202. In some embodiments, the LEDs 206 are disposed on LED substrate 202 in a recursive pattern on a first surface of the substrate 202. The recursive pattern maximizes the use of the available surface area of the first surface of the substrate 202. In some embodiments, the recursive pattern is a serpentine structure including a plurality of rows of LEDs 206, such that each row of LEDs 206 is electrically coupled to at least one other row of LEDs 206 as shown in FIGS. 3-5. The distance between each row of LEDs is selected to minimize a current leakage between each row of LEDs.

FIG. 3 is a schematic top view of a portion of an LED array 204 and depicts embodiments of an LED array 204 where LEDs are connected in series, via wire bonds, in a recursive pattern on the first surface of the substrate 202. Each LED unit 302 may include and LED portion 304, a metal pad 306, and one or more wire bonds 308. Each LED unit 302 may be connected to another LED unit 302 via the wire bonds 308. A first end of the LED units 302 connected in series may include a power source wire contact pad 310 configured to receive power from a power source to power the LED units 302. In some embodiments, the power source wire contact pad 310 may be disposed on a backside of the substrate. A second end of the LED units 302 connected in series may include a ground wire contact pad 312 to complete the electrical circuit and ground the LED array 204. In some embodiments, the ground wire contact pad 312 may be disposed on a top surface of the substrate (e.g., same surface as the LEDs). At each turn in the recursive pattern, a metal pad 314 may be used that is larger than metal pads 306 in order to facilitate the 180 degree turn in the recursive pattern.

Each LED portion 304 may be about 0.5 mm to about 15 mm in length 324 and about 0.5 mm to about 15 mm in width 326. In some embodiments consistent with FIG. 3, each LED portion 304 may be about 1.07 mm square. The LED portions 304 may be separated from each other by a distance 322 of about 0.1 mm to about 0.5 mm within each column, and may be separated from each other by a distance 320 of about 0.1 mm to about 0.5 mm between each row of LED units 302. In some embodiments, the packing efficiency (or fill factor) of the embodiments described with respect to FIG. 3 may be about 30% to approaching 100% of the total surface area of the substrate 202.

FIG. 4 is a schematic top view of a portion of an LED array 204 and depicts embodiments of an LED array 204 where LEDs are direct attach LEDs connected in series, in a recursive pattern on the first surface of the substrate 202. Each LED unit 402 may include and LED portion 404 and a metal pad 406. Direct attached LEDs do not use wire bonds as shown in FIG. 3. Each LED unit 402 may be connected to another LED unit 402 via the metal pads 406. A dielectric separator 430 may be used to electrically separate the LED units 402. A first end of the LED units 402 connected in series may include a power source wire contact pad 410 configured to receive power from a power source to power the LED units 402. A second end of the LED units 402 connected in series may include a ground wire contact pad 412 to complete the electrical circuit and ground the LED portion 404. At each turn in the recursive pattern, a metal pad 414 may be used in order to make the 180 degree turn in the recursive pattern.

Each LED portion 404 may be about 0.3 mm to about 15 mm in length and width 324. In some embodiments consistent with FIG. 4, each LED portion 404 may be about 0.7 mm square. The LED portions 404 may be separated from each other by a distance 320 of about 0.1 mm to about 0.5 mm between each row of LED units 402. In some embodiments, the packing efficiency (or fill factor) of the embodiments described with respect to FIG. 4 may be about 40% to approaching 100% of the total surface area of the substrate 202.

FIG. 5 is a schematic top view of an LED array 204 and depicts embodiments of an LED array 204 where multiple strings 522a and 522b of LED strings disposed on substrate 202, wherein each set of LED strings 522a and 522b includes direct attach LEDs connected in series, in a recursive pattern on a rectangular cross section substrate 202.

Each column of LED units 402 is connected to another column of LED units 402 via electrical connections 510. In FIG. 5, power source contact pads 410 are coupled to power sources 514, and ground contact pads 412 are coupled to ground 516. In some embodiments each LED string (e.g., 522*a*) may have a recursive pattern that mirrors the recursive pattern of LED string (e.g., 522*b*).

In some embodiments, the substrate 202 may be circular or disk shaped and have a diameter of about 50 mm to about 500 mm. In some embodiments, the diameter may be about 11 mm to be compatible with conventional lamps used in existing RTP chambers. In some embodiments consistent with FIG. 6, LED array 204 can connect to lamp sockets used by existing conventional lamps.

Figure 6:
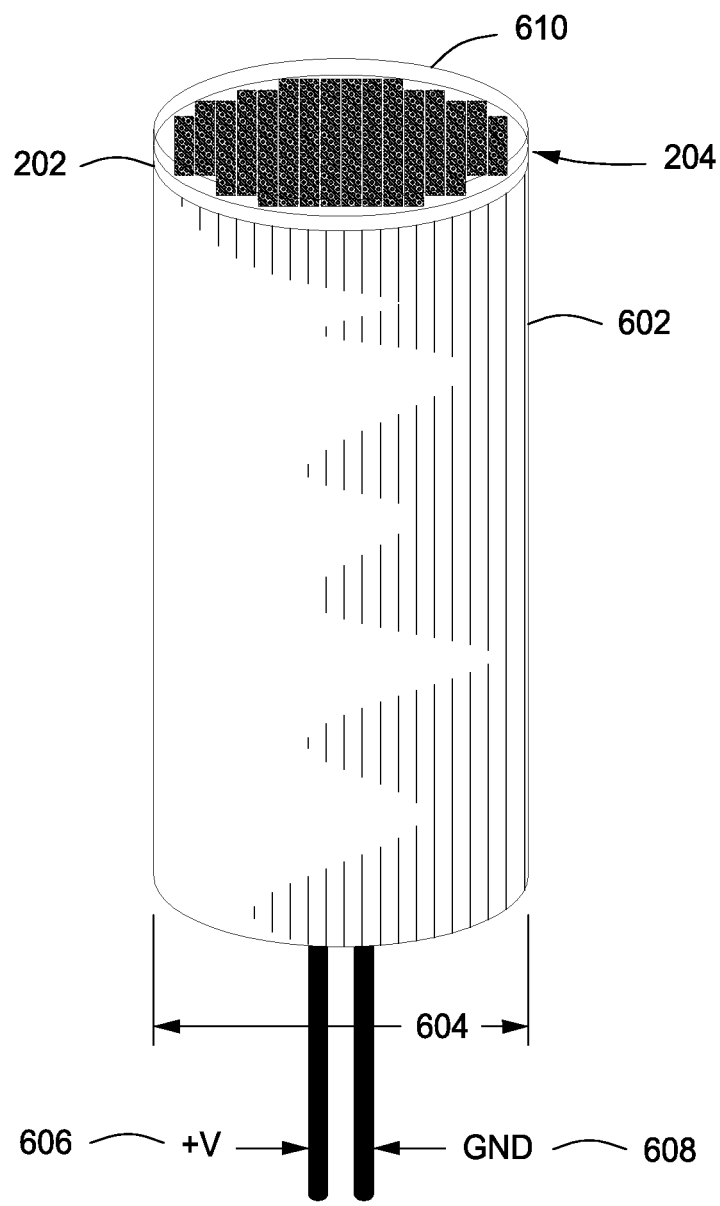
FIG. 6 is an isometric view of an LED array that can connect to lamp sockets used by existing conventional lamps in accordance with some embodiments of the present invention.

Due to the high packing density of the LED arrays 204 described in embodiments of the present invention, some embodiments may require the use of heat dissipation devices such as a heat sink 602 as shown in FIG. 6. In some embodiments, a heat sink 602 may be coupled to backside of the substrate (opposite the side of the substrate with the LEDs disposed thereon). The heat sink 602 is configured to remove heat from the substrate. In some embodiments, the heat sink 602 is cylindrical, although other geometric shapes may be used. The heat sink 602 may have a diameter 604 substantially equal to that of LED substrate 202. The heat sink 602 may include a central opening through the center or the heat sink. A set of electrical connectors 606, 608 electrically coupling the LED array 204 to a power source and ground may pass through the central opening of heat sink 602.

In some embodiments, the LED array 204 may include a LED encapsulation layer 610 to protect LEDs 206 or LED array 204.

While the foregoing is directed to embodiments of the present invention, other and further embodiments of the invention may be devised without departing from the basic scope thereof.

The invention claimed is:

1. An apparatus for providing pulsed or continuous energy in a semiconductor process chamber, the apparatus comprising:
a process chamber body of the semiconductor process chamber;
one or more solid state source arrays providing pulsed or continuous energy to the semiconductor process chamber, wherein each of the one or more solid state source arrays includes:
a substrate having at least one plurality of solid state light sources disposed on a first surface of the substrate,
wherein each of solid state light sources within the at least one plurality of solid state light sources is connected in series and in a recursive pattern on the first surface of the substrate,
wherein a packing efficiency is greater than 65% of a total surface area of the first surface of the substrate, and wherein a distance between each row of solid state light sources of the at least one plurality of solid state light sources is selected to minimize a current leakage between each row of solid state light sources of the at least one plurality of solid state light sources; and
a heat sink coupled to a second surface of the substrate configured to remove heat from the substrate; and
a power source coupled to one or more solid state source arrays to electrically power the at least one plurality of solid state light sources.

2. The apparatus of claim 1, further comprising:
a set of electrical connectors electrically coupling the one or more solid state source arrays to the power source, wherein the set of electrical connectors pass through a central opening formed in the heat sink.

3. The apparatus of claim 2, wherein the at least one plurality of solid state light sources is grouped into groups of solid state light sources.

4. The apparatus of claim 3, wherein each group of solid state light sources is separately controllable by a controller.

5. The apparatus of claim 1, wherein the recursive pattern is a serpentine structure including a plurality of rows of solid state light sources, and wherein each row of solid state light sources is electrically coupled to at least one other row of solid state light sources.

6. The apparatus of claim 5, wherein each row of solid state light sources is spaced from about 0.1 mm and about 0.5 mm apart from each other.

7. The apparatus of claim 1, further comprising a second plurality of solid state light sources disposed on the first surface of the substrate, wherein the second plurality of solid state light sources are connected in series and in a recursive pattern on the first surface of the substrate.

8. The apparatus of claim 7, wherein the recursive pattern of second plurality of solid state light sources mirrors the recursive pattern of the at least one plurality of solid state light sources.

9. The apparatus of claim 1, wherein the at least one plurality of solid state light sources are light emitting diodes (LEDs).

10. The apparatus of claim 9, wherein each of the LEDs is a wire-bond-free direct attach LED directly attached to the substrate without the use of wire-bonds.

11. The apparatus of claim 9, wherein each of the LEDs are wire-bonded to the substrate and to at least one other LED.

12. The apparatus of claim 9, wherein each of the LEDs include a light emitting diode portion, an electrical contact pad, and one or more wire bonds.

13. The apparatus of claim 1, wherein the at least one plurality of solid state light sources have a switch-on time from about 0.5 nanoseconds to about 10 nanoseconds and a switch-off time from about 0.5 nanoseconds to about 10 nanoseconds.

14. The apparatus of claim 1, wherein a first end of the at least one plurality of solid state light sources connected in series is a power source wire contact pad configured to receive power from a power source to power the at least one plurality of solid state light sources, and a second end of the at least one plurality of solid state light sources is ground wire contact pad.

15. The apparatus of claim 1, wherein the substrate has a circular cross section and is configured to connect to lamp sockets used by lamps that are not solid state light sources.

* * * * *